United States Patent [19]

Veltri

[11] Patent Number: 5,298,287
[45] Date of Patent: Mar. 29, 1994

[54] METHOD OF MAKING CVD SI$_3$N$_4$

[75] Inventor: Richard D. Veltri, East Hartford, Conn.

[73] Assignee: United Technologies Corporation, Hartford, Conn.

[21] Appl. No.: 13,862

[22] Filed: Feb. 5, 1993

[51] Int. Cl.$^5$ ............................................. C23C 16/00
[52] U.S. Cl. ............................... 427/255.2; 427/255.1; 427/248.1; 427/314
[58] Field of Search ............... 427/248.1, 255.1, 255.2, 427/314; 118/715

[56] References Cited

U.S. PATENT DOCUMENTS

| | | | |
|---|---|---|---|
| 3,226,194 | 12/1965 | Kuntz | 23/191 |
| 4,214,037 | 7/1980 | Galasso et al. | 428/367 |
| 4,289,801 | 9/1981 | Galasso et al. | 427/94 |
| 4,472,476 | 9/1984 | Veltri et al. | 428/215 |
| 4,500,483 | 2/1985 | Veltri et al. | 264/81 |
| 4,610,896 | 9/1986 | Veltri et al. | 427/140 |
| 4,617,997 | 6/1987 | Galasso et al. | 428/408 |
| 4,981,102 | 1/1991 | Gautreaux et al. | 118/725 |

FOREIGN PATENT DOCUMENTS 61-56277  3/1986  Japan .
1-92335   4/1989  Japan .

Primary Examiner—Roy V. King
Attorney, Agent, or Firm—George J. Romanik

[57] ABSTRACT

CVD Si$_3$N$_4$ can be made by placing a substrate (2) inside a CVD reactor (4) having an interior and interior walls (6). The interior walls of the reactor are include a high temperature metal selected from the group consisting of Mo, Nb, Rh, Hf, Ta, W, Re, and Ir. An inert gas is flowed through the reactor (4) and the pressure inside the reactor is reduced to less than about 40 kPa. The substrate (2) and interior of the reactor (4) are heated to a temperature between about 1200° C. and about 1700° C. A reactant gas mixture of a silicon halide and an excess of a nitrogen-containing compound is flowed into the reactor such that the silicon halide reacts with the nitrogen-containing compound to form Si$_3$N$_4$. The high temperature metal on the interior walls (6) of the reactor (4) inhibits the formation of Si$_3$N$_4$ on the interior walls of the reactor so the majority of the Si$_3$N$_4$ forms on the substrate (2).

12 Claims, 4 Drawing Sheets

300 X     100μm

300 X     100μm

METHOD OF MAKING CVD SI$_3$N$_4$

TECHNICAL FIELD

The present invention is directed to a method of making CVD Si$_3$N$_4$.

BACKGROUND ART

Silicon nitride (Si$_3$N$_4$) is useful in applications that require oxidation and wear resistance, high emissivity, and low thermal and electrical conductivity. Si$_3$N$_4$ can be used in bulk form or as a matrix or coating for composites. For example, crystalline Si$_3$N$_4$ can be used to coat carbon-carbon composites as taught in commonly assigned U.S. Pat. No. 4,472,476 to Veltri et al. Similar coatings and Si$_3$N$_4$ processes are disclosed in U.S. Pat. No. 3,226,194 to Kuntz, and commonly assigned U.S. Pat. Nos. 4,214,037, 4,289,801, and 4,671,997 to Galasso et al. and 4,500,483 and 4,610,896 to Veltri et al.

Crystalline Si$_3$N$_4$ can be made with a chemical vapor deposition (CVD) process described in U.S. Pat. No. 3,226,194 to Kuntz, herein incorporated by reference in its entirety. When used to make matrices for composites, the same process is called chemical vapor infiltration (CVI). Si$_3$N$_4$ made by a CVD reaction often is called CVD Si$_4$N$_4$.

The CVD reaction typically takes place at pressures less than about 40 kPa (absolute) inside a closed, cylindrical, graphite reactor. Substrates to be coated or infiltrated with matrix are held in place inside the reactor with graphite fixtures. After heating the substrate and interior of the reactor to a reaction temperature between about 1200° C. and about 1700° C., reactant gases are admitted to the bottom of the reactor. Typical reactant gases include silicon fluoride (SiF$_4$) and ammonia (NH$_3$). The reactant gases flow upwards (axially) through the reactor and react to form Si$_3$N$_4$ until one of the reactant gases, usually SiF$_4$, is expended. In prior art methods, the Si$_3$N$_4$ deposits uniformly on the interior walls of the reactor, the fixtures, and the substrate. The radially uniform deposition has been attributed to homogenous mixing of the reactant gases within a few centimeters of the bottom of the reactor. Useable Si$_3$N$_4$ is that which forms on the substrate. Because only a fraction of the reactant gases makes useable Si$_3$N$_4$, the prior art method can be costly.

Another drawback of the prior art method is short reactor life. The combination of high reaction temperature, corrosive reactant gases (especially NH$_3$), and temperature cycling can cause the graphite CVD reactors to crack after only several runs. Typical reactor life can be about 4 to about 12 runs. To protect expensive graphite heating elements that surround the reactor from corrosive reactant gases that may leak through cracks in the reactor, cracked reactors must be discarded. The need to replace reactors frequently also contributes to the costliness of the prior art method.

Therefore, what is needed in the industry is a method of making Si$_3$N$_4$ that deposits less Si$_3$N$_4$ on reactor walls and fixtures than prior art methods. It also would be desirable if reactor life could be extended.

DISCLOSURE OF THE INVENTION

The present invention is directed to a method of making Si$_3$N$_4$ that deposits less Si$_3$N$_4$ on reactor walls and fixtures than prior art methods and extends reactor life.

One aspect of the invention includes a method of making CVD Si$_3$N$_4$ in which a substrate is placed inside a CVD reactor having an interior and interior walls. The interior walls of the reactor comprise a high temperature metal selected from the group consisting of Mo, Nb, Rh, Hf, Ta, W, Re, and Ir. An inert gas is flowed through the reactor and the pressure inside the reactor is reduced to a reaction pressure less than about 40 kPa. The substrate and interior of the reactor are heated to a reaction temperature between about 1200° C. and about 1700° C. A reactant gas mixture comprising silicon halide and an excess of a nitrogen-containing compound is flowed into the reactor such that the silicon halide reacts with the nitrogen-containing compound to form Si$_3$N$_4$. The high temperature metal on the interior walls of the reactor inhibits the formation of Si$_3$N$_4$ on the interior walls of the reactor so the majority of the Si$_3$N$_4$ forms on the substrate.

These and other features and advantages of the present invention will become more apparent from the following description and accompanying drawing.

BEST MODE FOR CARRYING OUT THE INVENTION

Figure 1:
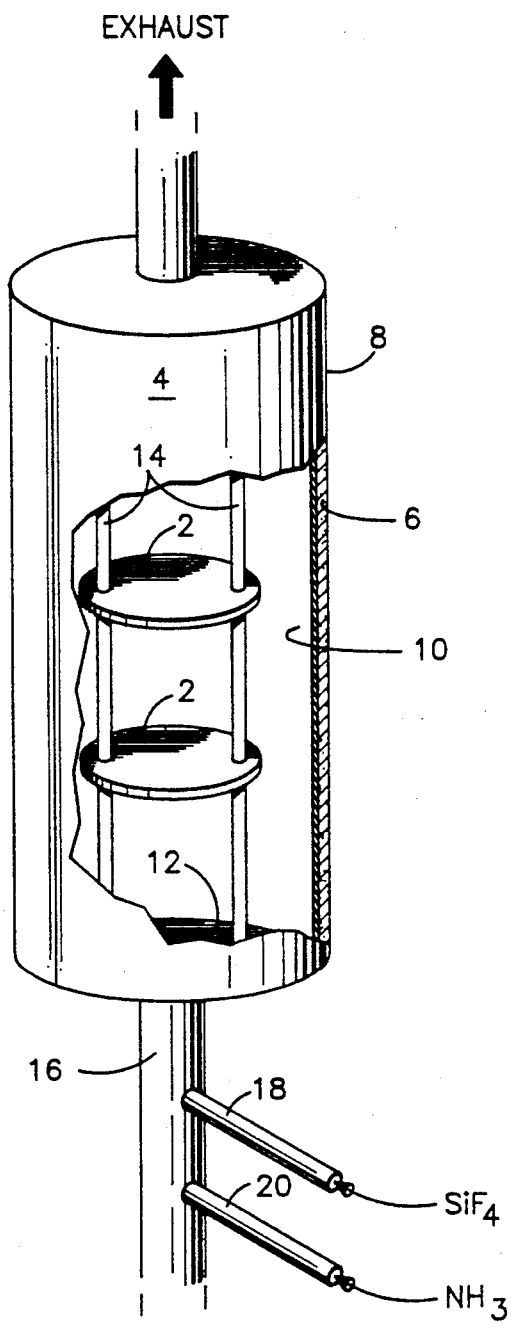
FIG. 1 is a cut away, perspective view of a reactor of the present invention.

The method of the present invention deposits Si$_3$N$_4$ on substrates 2 positioned in the interior of a reactor 4 shown in FIG. 1. At least a portion of the interior walls 6 of the reactor 4 comprise a high temperature metal that inhibits the formation of Si$_3$N$_4$ on the interior walls. If desired, the entire reactor 4, including the interior walls 6, may be made from the high temperature metal. Preferably, the reactor 4 will comprise a closed, cylindrical graphite body 8 and a liner 10 that covers at least a portion of the interior walls 6. The liner 10 comprises the high temperature metal and, in effect, becomes the interior walls of the reactor 4. The high temperature metal may be any metal that inhibits the formation of Si$_3$N$_4$ on the interior walls 6 or liner 10 at temperatures encountered when making CVD Si$_3$N$_4$. In addition, the high temperature metal should not undergo significant reactions with reactant gases. Suitable metals include Mo, Nb, Rh, Hf, Ta, W, Re, and Ir. The preferred high temperature metal is Mo because it is readily available in pure form as a relatively inexpensive sheet stock. The liner 10 may be any convenient thickness and size. Good results have been obtained with metal foils up to about 0.4 mm thick. If desired, the liner 10 may be thicker than 0.4 mm, although a thicker liner may provide no additional benefit. Preferably, the liner 10 will cover all interior walls 6 of the reactor 4, including the bottom wall 12. Because the reactant gases often are expended before they reach the top of the reactor, however, it may not be necessary to line all the interior walls 6. At least some of the benefits of the present invention have been obtained with liners that cover only the bottom wall 12 and the lower 30% of the vertical interior walls 6.

As is known in the art, the substrates 2 may be supported inside the reactor 4 with fixtures 14. To inhibit $Si_3N_4$ from depositing on the fixtures 14, the fixtures also may be made from a high temperature metal. The present invention may be used with any of the substrates conventionally used with $Si_3N_4$ coatings or matrices. For example, the substrate may be a composite with the following fiber/matrix combinations: carbon/carbon, SiC/carbon, SiC/SiC, or SiC/$Si_3N_4$.

Although the reactor used with the method of the present invention may be newly constructed, excellent results have been obtained by retrofitting existing graphite CVD reactors with high temperature metal liners. A Mo foil liner also has been fitted to a reactor that had been withdrawn from service because it developed a crack. After the Mo foil liner was installed, the reactor has been successfully used for more than 25 coating runs without failing.

To make CVD $Si_3N_4$ by the method of the present invention, the pressure in the reactor 4 is reduced to less than about 40 kPa (absolute) and, preferably, to less than about 13 kPa. Most preferably, the pressure will be less than about 1.1 kPa. Good results have been obtained with pressures between about 100 Pa and about 550 Pa. While the pressure is reduced, an inert gas, such as Ar, is flowed through the reactor and the temperature inside the reactor is raised to a reaction temperature between about 1200° C. and about 1700° C. Preferably, the temperature will be about 1400° C. to about 1500° C. The reactor may be heated from room temperature to the reaction temperature at a moderate rate, for example, over the course of about 90 minutes.

Once the pressure inside the reactor stabilizes at the desired pressure and the reactor has reached the reaction temperature, a reactant gas mixture is admitted to the bottom of the reactor 4 through a coaxial reactant injection line 16. The reactant gas mixture should comprise a silicon halide and an excess of a nitrogen-containing compound. The silicone halide enters the reactant injection line 16 through a silicon halide injection line 18. The nitrogen-containing compound enters the reactant injection line 16 through a nitrogen-containing compound injection line 20. The preferred silicon halide is $SiF_4$ and the preferred nitrogen-containing compound is $NH_3$. The reactant gas mixture may contain about 40% to about 90% $NH_3$ and, preferably, will contain about 50% to about 86% $NH_3$. The remainder of the reactant gas mixture should be the silicon halide.

After entering the reactor, the reactant gas mixture flows upward (axially) through the reactor and the silicon halide and nitrogen-containing compound react to form a layer of phase-pure $\alpha$-$Si_3N_4$ on the substrates 2. The high temperature metal liner 10 inhibits the formation of $Si_3N_4$ on the interior walls 6, 12 and liner. As a result, most of the $Si_3N_4$ deposits on the substrates 2. If the fixtures 14 also comprise the high temperature metal, substantially all the $Si_3N_4$ deposits on the substrates 2. The reason the high temperature metal inhibits $Si_3N_4$ formation is currently not understood. The rate of coating deposition is directly proportional to the temperature, pressure, and reactant concentration inside the reactor 4. Varying these parameters and the time for which the substrates 2 are exposed to reaction conditions allows the coating thickness to be controlled.

The substrates 2 are normally coated in at least two runs to permit their orientation to be changed after each run. Changing substrate orientation provides a more uniform coating and allows areas that were shadowed during the first run because they contacted or were obscured by fixtures 14 to be coated in a later run. If the reactor contains more than one substrate 2 as in FIG. 1, the position of the substrates can be reversed in later runs to coat the substrates evenly. The coating of the present invention may be any desired thickness. For example, the coatings may be between about 25 $\mu$m and about 750 $\mu$m thick.

The amount of $Si_3N_4$ deposited on the substrates 2 may be further increased by flowing a pusher gas through the reactor in addition to the reactant gases. The pusher gas may be any gas that does not react with the reactant gases, substrate, or high temperature metal. Suitable pusher gases include noble gases such as He, Ne, Ar, or Kr. Ar is preferred because it is readily available at low cost. Preferably, the pusher gas will be added to the reactor through the silicon halide injection line 18. The pusher gas increases the velocity of the silicon halide through the reactor, producing $Si_3N_4$ coatings higher in the reactor. In addition, the pusher gas produces thicker $Si_3N_4$ throughout the reactor. While any amount of pusher gas can be added to the reactor, good results have been achieved with pusher gas flow rates that are at least about 5 times the flow rate of the silicon halide. Preferably, the pusher gas flow rate will be at least about 10 times the flow rate of the silicon halide.

The following examples demonstrate the present invention without limiting the invention's broad scope.

EXAMPLE 1

Prior Art

Graphite Reactor, No Pusher Gas

Two graphite rods were fixed vertically inside a cylindrical, graphite CVD reactor. The reactor had an outside diameter of 15.2 cm (6 inches), an inside diameter of 12.7 cm (5 inches), and was 50.8 cm (20 inches) long. The rods were 0.64 cm (0.25 inch) in diameter and 30.5 cm (12 inches) long. The bottoms of the rods were fixed to a plate placed on the bottom of the reactor. While Ar was flowed through the reactor, the pressure inside the reactor was reduced to about 240 Pa (1.8 Torr) and the temperature inside the reactor was increased from room temperature to about 1430° C. over about 90 minutes. Once the pressure stabilized, the flow of Ar was stopped and about 98 cm$^3$/min $SiF_4$ and about 590 cm$^3$/min $NH_3$ were flowed into the reactor. After about 4 hours, the flow of $SiF_4$ and $NH_3$ were stopped and the gases in the reactor were pumped out. Ar was then flowed through the reactor and the reactor was allowed to cool to room temperature over night.

Figure 2:
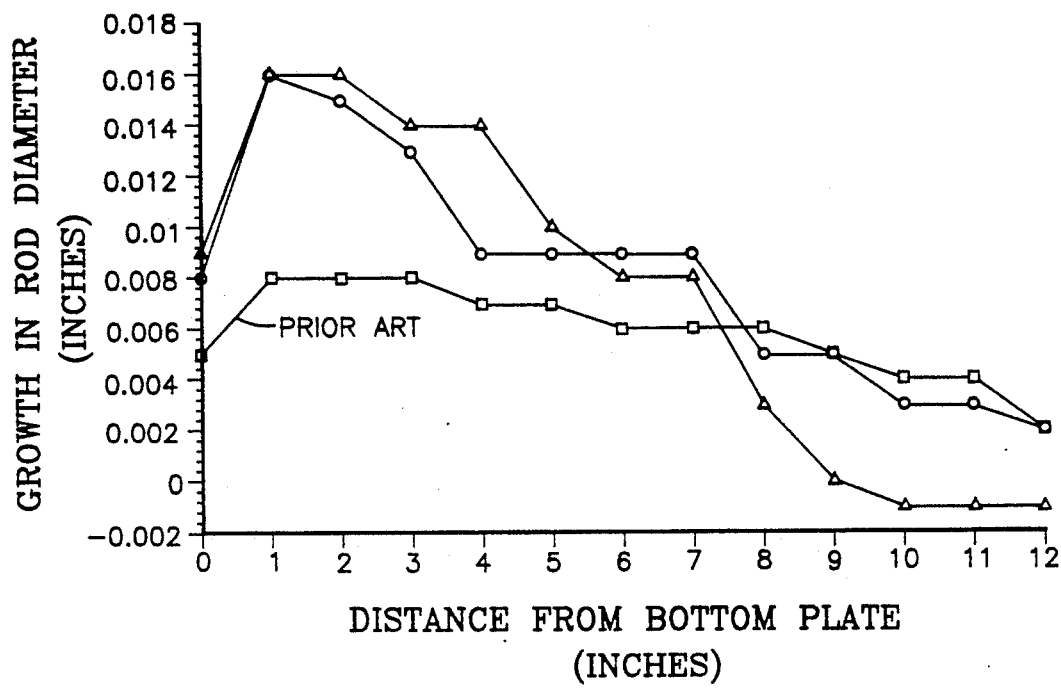
FIG. 2 is a graph that compares the growth in diameter along the length of a test rod for the prior art method and a method of the present invention.
Figure 3:
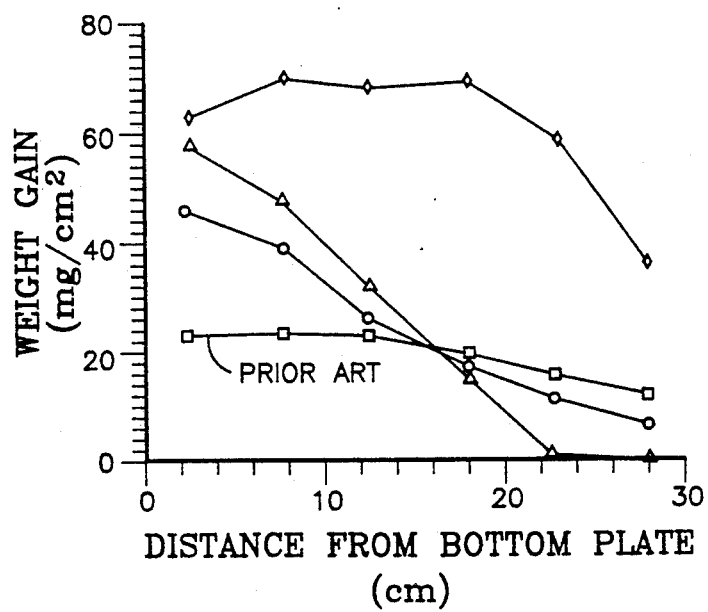
FIG. 3 is a graph that compares the weight gain along the length of a test rod for the prior art method and three methods of the present invention.
Figure 4:
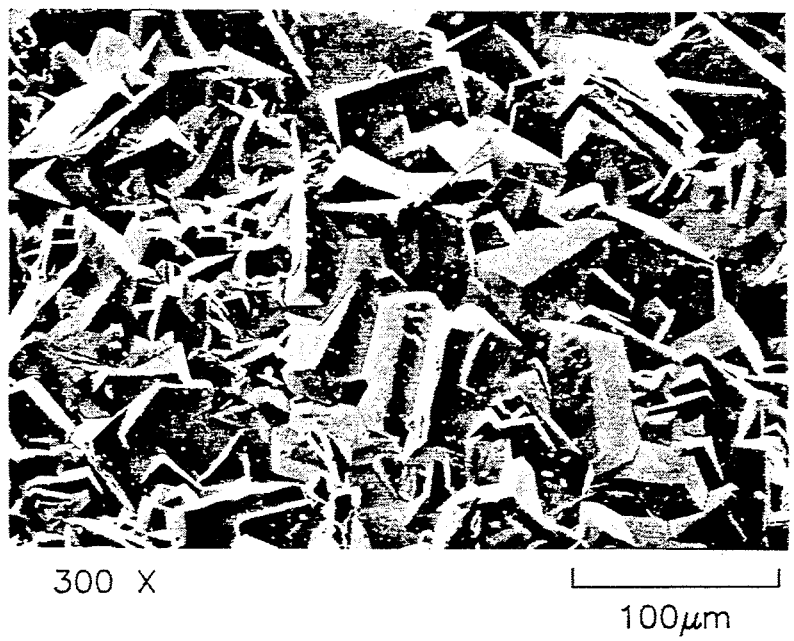
FIG. 4 is a scanning electron micrograph (SEM) of a prior art Si$_3$N$_4$ coating.
Figure 6:
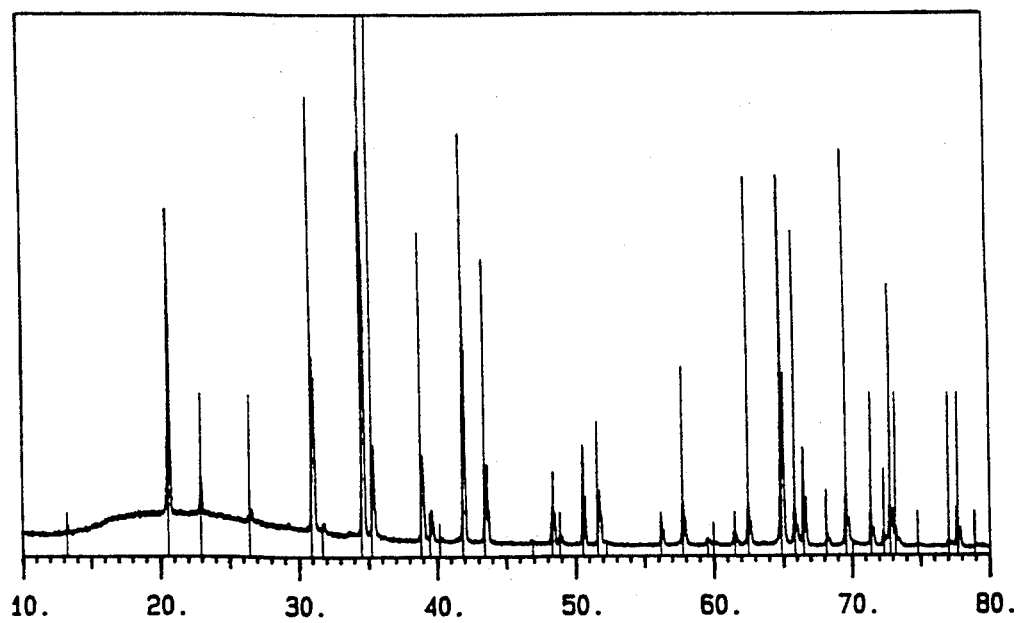
FIG. 6 is an x-ray diffraction pattern for a prior art Si$_3$N$_4$ coating.

When the reactor was opened, $Si_3N_4$ was found on the rods and interior reactor walls. The rods were removed from the reactor and analyzed. A total of 1.9204 g of $Si_3N_4$ was found on the rods. The distribution of $Si_3N_4$ on the rods was characterized by measuring the change in diameter of one rod at 2.5 cm (1 inch) increments. These data are shown as squares on FIG. 2. Several 1 cm segments were cut from the rod at intervals of 2.5 cm (1 inch), 7.6 cm (3 inches), 12.7 cm (5 inches), 17.8 cm (7 inches), 22.9 cm (9 inches) and 27.9 cm (11 inches) from the rod's base. The amount of $Si_3N_4$ on each segment, reported as mg of $Si_3N_4$ per $cm^2$ of coated area, was measured by weighing the segment, burning away the graphite in the segment, and weighing the residue. The data are shown as squares in FIG. 3. FIG. 4 is a scanning electron micrograph (SEM) of the $Si_3N_4$ coating made in this example. FIG. 6 is an x-ray diffraction pattern for the same coating.

EXAMPLE 2

Present Invention

Mo-Lined Reactor (6 inches), No Pusher Gas

Figure 5:
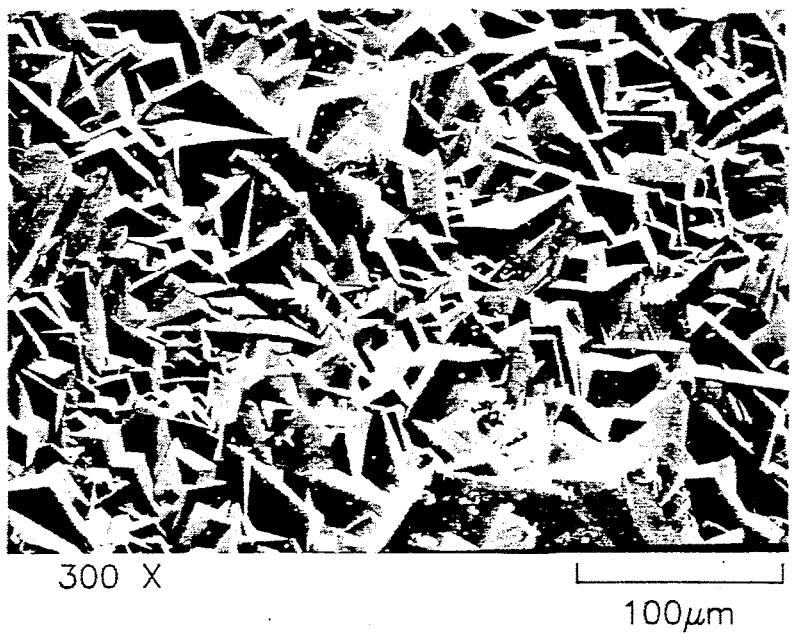
FIG. 5 is a SEM of a Si$_3$N$_4$ coating made by a method of the present invention.
Figure 7:
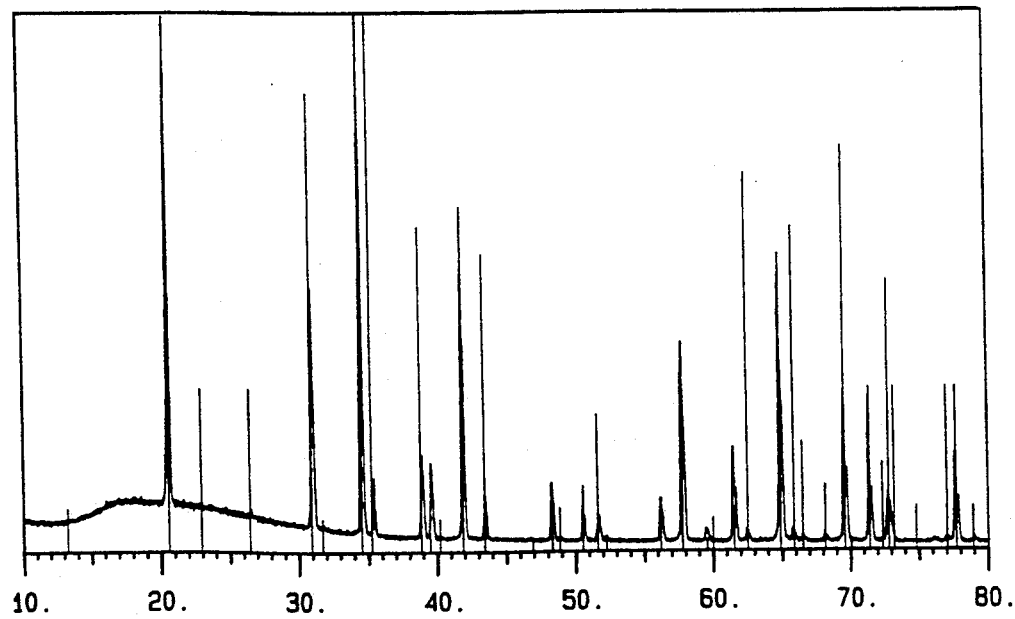
FIG. 7 is an x-ray diffraction pattern for a Si$_3$N$_4$ coating made by the method of the present invention.

The bottom of the reactor from Example 1 was covered with a circular piece of 0.05 mm (0.002 inches) thick Mo foil. The lower 15.2 cm (6 inches) of the reactor was covered with a piece of 0.1 mm (0.004 inches) thick Mo foil. Two graphite rods indentical to those used in Example 1 were fixed inside the reactor and were coated with $Si_3N_4$ as in Example 1. When the reactor was opened at the end of the coating run, $Si_3N_4$ was found on the rods, but not on the interior reactor walls. The distribution of $Si_3N_4$ on the rods was measured was in Example 1. The data (circles on FIGS. 2 and 3) show that the present invention deposited significantly more $Si_3N_4$ on the lower portions of the rod than the prior art method. The present invention also deposited more $Si_3N_4$ overall than the prior art method. FIG. 5 is a SEM of the $Si_3N_4$ coating made in this example. FIG. 7 is an x-ray diffraction pattern for the same coating. The SEM and x-ray diffraction pattern shown the $Si_3N_4$ made in this example is substantially the same as the $Si_3N_4$ made in Example 1.

EXAMPLE 3

Present Invention

Mo-Lined Reactor (12 inches), No Pusher Gas

Example 2 was repeated with 30.5 cm (12 inches) of Mo foil lining the lower portion of the reactor. After opening the reactor, a total of 3.2023 g of $Si_3N_4$ was found on the rods, 1.668 times as much as was deposited in Example 1. The distribution of $Si_3N_4$ on the rods was measured was in Example 1. The data (triangle on FIGS. 2 and 3) show that even more $Si_3N_4$ was deposited on lower portions of the rods than in Examples 1 and 2. The points in FIG. 2 that show no growth or negative growth in rod diameter indicate that the $SiF_4$ was expended before reaching the 22.9 cm (9 inch) point. As a result, no more $Si_3N_4$ was formed after this point. The negative growth was caused by excess $NH_3$ etching away part of the graphite rods.

EXAMPLE 4

Present Invention

Mo-Lined Reactor (12 inches), Pusher Gas

Example 3 was repeated by flowing 1200 $cm^3$/min of Ar through the $SiF_4$ injection line in addition to the 98 $cm^3$/min of $SiF_4$ flowing through the line. When the rods from this run were analyzed, significantly more $Si_3N_4$ was found than in Examples 1-3. Data from this run (diamonds in FIG. 3) show the benefit of combining a high temperature metal lining in the reactor with a pusher gas.

In addition to the runs reported above, many more runs were made to test the present invention. The present invention consistently deposited more $Si_3N_4$ than the prior art method. For runs without pusher gas in which the reactor was lined with 30.5 cm (12 inches) or more of Mo, the present invention produced about 70% or more additional $Si_3N_4$ compared to the prior art. Analysis of the Mo foils after numerous runs showed that the foils picked up small amounts of Si and C and became somewhat brittle. In all cases, though, the foils could be readily handled, even after many runs.

The present invention provides several benefits over the prior art method of making $Si_3N_4$. First, for a fixed amount of reactants, the method of the present invention significantly increases the amount of $Si_3N_4$ deposited. Therefore, the present invention can either make thicker coatings than the prior art with the same amount of reactants or make coatings of the same thickness as the prior art with smaller amounts of reactants. Because none of the $Si_3N_4$ forms on the reactor walls, most or all of the $Si_3N_4$ is usable product. These two factors combine to make the method of the present invention more cost effective than the prior art method.

A side benefit of the present invention is increased reactor life. While prior art reactors typically need to be replaced after about 4 to about 12 runs, reactors of the present invention have been successfully used for more than 30 runs and are still operating without any sign of failure. In addition, a cracked reactor that was unsuitable for the prior art method was lined with Mo foil and successfully used with the method of the present invention. The improved reactor service life provided by the present invention further enhances the cost effectiveness of the method of the present invention compared to the prior art method.

The invention is not limited to the particular embodiments shown and described herein. Various changes and modifications may be made without departing from the spirit or scope of the claimed invention.

I claim:
1. A method of making CVD $Si_3N_4$, comprising the steps of:
    (a) placing a substrate inside a CVD reactor having an interior and interior walls, wherein the interior walls of the reactor consist essentially of a high temperature metal selected from the group consisting of Mo, Nb, Rh, Hf, Ta, W, Re, and Ir,
    (b) flowing an inert gas through the reactor,
    (c) reducing the pressure inside the reactor to a reaction pressure less than about 40 kPa,
    (d) heating the substrate and interior of the reactor to a reaction temperature between about 1200° C. and about 1700° C., and
    (e) flowing a reactant gas mixture comprising about 40 volume % to about 90 volume % of a nitrogen-containing compound, balance silicon halide, into the reactor such that the silicon halide reacts with the nitrogen-containing compound to form $Si_3N_4$, whereby the high temperature metal inhibits the formation of $Si_3N_4$ on the interior walls of the reactor.

2. The method of claim 1, wherein the reaction temperature is about 1390° C. to about 1490° C.

3. The method of claim 1, wherein the reaction pressure is about 100 Pa to about 550 Pa.

4. The method of claim 1, wherein the silicon halide comprises $SiF_4$ and the nitrogen-containing compound comprises $NH_3$.

5. The method of claim 1, wherein the high temperature metal consists essentially of Mo.

6. The method of claim 1, wherein the substrate is supported with a fixture consisting essentially of the high temperature metal, whereby the high temperature metal inhibits the formation of $Si_3N_4$ on the fixture so substantially all the $Si_3N_4$ forms on the substrate.

7. The method of claim 1, further comprising the step of:

(f) flowing a pusher gas into the reactor at the same time the reactant gas mixture is flowed into the reactor, wherein the pusher gas is flowed into the reactor in combination with the silicon halide through a common injection line.

8. The method of claim 7, whrein the high temperature metal consists essentially of Mo.

9. The method of claim 7, wherein the pusher gas comprises a noble gas.

10. The method of claim 7, wherein the flow rate of pusher gas is at least about 5 times the flow rate of the silicon halide.

11. The method of claim 7, wherein the flow rate of pusher gas is at least about 10 times the flow rate of the silicon halide.

12. The method of claim 7, wherein the substrate is supported with a fixture consisting essentially of the high temperature metal, whereby the high temperature metal inhibits the formation of $Si_3N_4$ on the fixture walls so substantially all the $Si_3N_4$ forms on the substrate.

* * * * *